US010121981B2

(12) United States Patent
Ali et al.

(10) Patent No.: US 10,121,981 B2
(45) Date of Patent: Nov. 6, 2018

(54) FIELD EFFECT TRANSISTOR AND METHOD FOR PRODUCTION THEREOF

(71) Applicant: Saralon GmbH, Chemnitz (DE)

(72) Inventors: Moazzam Ali, Chemnitz (DE); Rakesh R Nair, Chemnitz (DE)

(73) Assignee: Saralon GmbH, Chemnitz (DE)

( * ) Notice: Subject to any disclaimer, the term of this patent is extended or adjusted under 35 U.S.C. 154(b) by 0 days.

(21) Appl. No.: 15/602,945

(22) Filed: May 23, 2017

(65) Prior Publication Data

US 2018/0026213 A1  Jan. 25, 2018

(30) Foreign Application Priority Data

Jul. 25, 2016 (GB) .................................. 1612830.8

(51) Int. Cl.
*H01L 21/00* (2006.01)
*H01L 51/05* (2006.01)
(Continued)

(52) U.S. Cl.
CPC ...... *H01L 51/057* (2013.01); *H01L 21/02527* (2013.01); *H01L 21/02623* (2013.01); *H01L 21/043* (2013.01); *H01L 21/044* (2013.01); *H01L 21/288* (2013.01); *H01L 21/28255* (2013.01); *H01L 21/6835* (2013.01);
(Continued)

(58) Field of Classification Search
CPC ......... H01L 21/02527; H01L 21/02623; H01L 21/043; H01L 21/044; H01L 21/28255; H01L 21/288
See application file for complete search history.

(56) References Cited

U.S. PATENT DOCUMENTS 4,620,208 A   10/1986  Fritzsche et al.
4,701,996 A   10/1987  Calviello
(Continued)

FOREIGN PATENT DOCUMENTS

EP   2059957 B1   5/2012

OTHER PUBLICATIONS

"Vertical Channel ZnO Thin-Film Transistors Using an Atomic Layer Deposition Method" by Chi-Sun Hwang et al, IEEE electron device letters, vol. 35, No. 3, Mar. 2014, pp. 360-362.
(Continued)

*Primary Examiner* — Samuel Gebremariam
(74) *Attorney, Agent, or Firm* — 24IP Law Group; Timothy R DeWitt (57) ABSTRACT

A vertical channel field-effect transistor is taught. The vertical channel field-effect transistor comprises a primary substrate and a secondary substrate. A bottom conducting layer is provided on the primary substrate. A top conducting layer is transferred from a secondary substrate to the primary substrate by using an insulating adhesive layer. The thickness of the insulating adhesive layer defines the channel length. The portion of the top conducting layer which is over the bottom conducting layer defines the maximum possible channel. At least one semiconducting layer is provided on and around a perimeter of at least a portion of the channel width. At least one insulating layer is provided on at least a portion of the at least one semiconducting layer. At least one gate conducting layer provided on at least a portion of the at least one insulating layer.

6 Claims, 7 Drawing Sheets

(51) Int. Cl.
*H01L 21/02* (2006.01)
*H01L 21/04* (2006.01)
*H01L 21/28* (2006.01)
*H01L 21/288* (2006.01)
*H01L 21/683* (2006.01)
*H01L 29/16* (2006.01)
*H01L 29/45* (2006.01)
*H01L 29/786* (2006.01)
*H01L 51/00* (2006.01)
*H01L 51/10* (2006.01)

(52) U.S. Cl.
CPC .......... *H01L 29/1606* (2013.01); *H01L 29/45* (2013.01); *H01L 29/78642* (2013.01); *H01L 29/78684* (2013.01); *H01L 51/003* (2013.01); *H01L 51/0004* (2013.01); *H01L 51/0021* (2013.01); *H01L 51/0024* (2013.01); *H01L 29/78696* (2013.01); *H01L 51/0022* (2013.01); *H01L 51/0035* (2013.01); *H01L 51/0037* (2013.01); *H01L 51/0048* (2013.01); *H01L 51/055* (2013.01); *H01L 51/0516* (2013.01); *H01L 51/0558* (2013.01); *H01L 51/105* (2013.01); *H01L 2221/68363* (2013.01)

(56) References Cited

U.S. PATENT DOCUMENTS

| | | | |
|---|---|---|---|
| 4,924,279 | A | 5/1990 | Shimbo |
| 6,664,576 | B1 | 12/2003 | Breen et al. |
| 8,481,360 | B2 * | 7/2013 | Smith .................... H01L 51/057 257/40 |
| 2007/0082438 | A1 | 4/2007 | Li et al. |
| 2007/0254402 | A1 | 11/2007 | Dimmler et al. |
| 2010/0133539 | A1 | 6/2010 | Kang et al. |
| 2013/0161732 | A1 | 6/2013 | Hwang et al. |

OTHER PUBLICATIONS

R. Parashkov, et al., "Vertical channel all-organic thin-film transistors," Applied Physics Letters, vol. 82, No. 25, pp. 4579-4580 (.

* cited by examiner

(Prior Art)

FIGURE 4

(Prior Art)

780
Providing a bottom conducting layer (620) on a primary substrate (610)

781
Providing a transferable conducting layer (632) on a secondary substrate (611)

782
Printing an insulating adhesive layer (670) on one of the bottom conducting layer (620) and the transferable conducting layer (632)

783
Laminating the primary substrate (610) and the secondary substrate (611)

784
Activating the insulating adhesive layer (670)

785
Delaminating the secondary substrate (611) from the primary substrate (610) to create the source-drain structure with a channel width (625)

786
Printing at least one semiconducting layer (640) on at least a portion of the channel width (625)

787
Printing at least one insulating layer (650) on at least a portion of the at least one semiconducting layer (640)

788
Printing at least one gate conducting layer (660) on at least a portion of the at least one insulating layer (650)

FIGURE 7

FIELD EFFECT TRANSISTOR AND METHOD FOR PRODUCTION THEREOF

CROSS-RELATION TO OTHER APPLICATIONS

This application claims priority to and benefit of UK Patent Application No GB1612830.8 filed on 25 Jul. 2016, the contents of which are incorporated herein by reference.

BACKGROUND OF THE INVENTION

Field Of The Invention

The present disclosure relates to vertical channel field-effect transistors (FET), and in one aspect of the disclosure to printed vertical channel field-effect transistors on which vertical channel is produced by transferring one conducting layer over another conducting layer by using printed insulating adhesive layers.

Brief Description of the Related Art

Printed field-effect transistors (FET) are generating an immense amount of research interest in present times due to potential applications in the field of inexpensive electronics, and more specifically, use-and-throw disposable electronics. A transistor is a fundamental building block of electronic technologies. So far the transistors mostly use inorganic materials like silicon, germanium or III-V materials. Silicon-based transistors are produced in a clean room environment by using sophisticated and expensive machines. Printed transistors can be produced by using conventional printing methods which are available all over the world in printing presses. If an efficient transistor can be produced by the conventional printing method, then the transistor can make a non-skilled printer capable of producing/manufacturing electronics by using conventional printing machines in ambient conditions. In the context of this document, an "efficient" transistor means a transistor with a switch-on voltage of less than 5 Volt, a high on-off ratio, and a charge mobility higher than 0.1 cm/(V.s)

Printed electronics have immense potential in the realm of cheap, disposable and flexible electronics with easier manufacturability. The relative ease in processing of organic semi-conductive and conductive inks also adds to the attraction of developing printed electronic devices. Printed FETs form the backbone of the flexible, low cost circuitry required to control printed electronic devices. In order to bring low-cost, disposable printed electronics into the market, it is desirable to develop a process of fabricating printed FETs that does away with issues relating to expensive or complex production steps. Many efforts have been made to date to fabricate printed FETs that try to eliminate issues pertaining to low mobility of the charge carriers within the semiconducting material and thereby high operating voltages. Most methods include the usage of high mobility semiconductors, improved capacitance of the dielectric layer, reduction of contact resistance in the case of source, drain and gate contacts and minimizing dielectric and semiconducting active layer interface traps. Novel materials e.g. carbon nanotubes, graphene, semiconducting polymers (e.g. poly (3-hexylthiophene-2,5-diyl)), hybrid semiconductors (e.g. semiconducting conjugated polymers with inorganic nanoparticles), semiconducting perovskite etc. for printed FETs have demonstrated improvements in the device performance of the printed FETs, but current printed FETs still remain unsuitable for practical applications due to issues related to difficulty in fabrication processes, material handling and low charge carrier mobility. The reason behind this unsuitability is that the channel length produced by printing methods is still more than 10 micrometers.

Figure 1A:
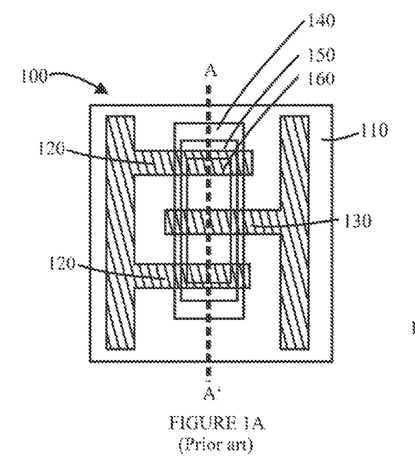
FIG. 1A is a top view of a prior art Field-effect transistor.
Figure 1B:
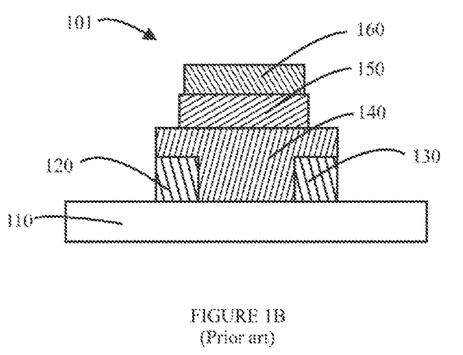
FIG. 1B is a cross-sectional view of a prior art Field-effect transistor.

The preferred architecture of the printed FET is that of coplanar interdigitated finger structures, as shown in FIG. 1A and FIG. 1B. FIG. 1A is the top view of the printed top gate FET 100 and FIG. 1B is the cross sectional view along the line A-A'. In the structure shown in FIG. 1A and 1B, the printed FET 100 comprises a first conducting layer 120 and a second conducting layer 130, printed in an interdigitated manner on a substrate 110. The first conducting layer 120 and the second conducting layer 130 represent a source-drain combination. The gap between the first conducting layer 120 and the second conducting layer 130 is the channel length. Over the first conducting layer 120 and the second conducting layer 130 a semiconducting layer 140 and a dielectric layer 150 are printed. A gate conducting layer 160 is printed as the final layer on top of the dielectric layer 150. Such architecture of the known printed FET has a large/long channel length (>20 micrometers). This compares to the channel length in a conventionally manufacture and commercially available FET in which the channel length is in the nanometer range.

The channel length of the printed FET is limited by the resolution of printing methods. Printing methods—offset, screen, gravure, flexo, ink-jet etc.—can not produce channel length of less than 20 micrometers, whilst still maintaining a high production yield. Producing source-drain interdigitated structure of a channel length less than 20 micrometers, by a printing method, creates a lot of short-circuits between source and drain, which hence lowers the production yield. Bottom gate FET produced by a printing method also encounters the same problem.

Figure 2:
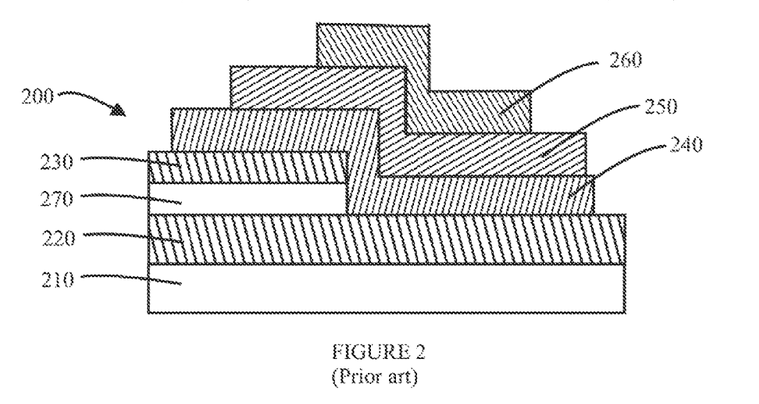
FIG. 2 is a cross-sectional view of a prior art vertical channel Field-effect transistor.

The vertical channel FET is an alternative to reducing the channel length substantially. Currently, the vertical channel FETs are produced by a combination of sophisticated techniques e.g. laser ablation, photoresist-masking, vacuum deposition. One technique of fabricating vertical channel FET has been reported in "Vertical Channel ZnO Thin-Film Transistors Using an Atomic Layer Deposition Method" by Chi-Sun Hwang et al, IEEE electron device letters, Vol. 35, no. 3, March 2014, pages 360-362. The vertical channel FET 200 is shown in FIG. 2. This describes a technique in which the architecture inculcates the process of depositing the first conducting layer 220 over a substrate 210 by radio frequency sputtering. An insulating layer 270 is patterned over the first conducting layer 220 using atomic layer deposition. A second conducting layer 230 is deposited over the insulating layer 270 using radio frequency sputtering. The resulting bilayer structure is then patterned using photolithography and wet etching processes to expose the source and drain regions. A semiconducting layer 240, a dielectric layer 250, and a gate conducting layer 260 are deposited respectively, using atomic layer deposition to complete the device. There are many reports related to vertical channel FET.

For example, European Patent number EP2059957-B1 describes an organic thin film transistor and a method for its fabrication, wherein a vertical channel architecture is incorporated. U.S. Pat. No. 6,664,576B1 describes a method of fabricating a vertical channel polymer based transistor. In the state-of-the-art vertical channel FETs, it is not possible to produce all the layers by printing alone, especially, it is not possible to produce a source-drain vertical channel. The problems associated with the production of vertical channel source-drain structure, by a printing method, are explained below in FIG. 3 and FIG. 4.

In the last decade, different functional inks have been developed for the printed FETs. These inks include: silver, PEDOT: PSS (Poly(2,3-dihydrothieno-1,4-dioxin)-poly(styrenesulfonate)), semiconducting polymers, dielectrics etc. The printing method has not to date solved the issue of the limited size of the channel lengths. It is clear from FIG. 1A and FIG. 1B that decreasing channel length below 20 micrometers is not possible by a conventional printing method. In order to achieve this goal, it is required to develop a completely new printing method or make substantial modifications in the conventional printing machine. In either case, production of the printed FETs in mass scale by printers will not be possible since a printer will not like to buy a new printing machine. Therefore, there is a need to develop a FET structure with shorter channel length that can be produced by conventional printing machines in ambient conditions.

Figure 3:
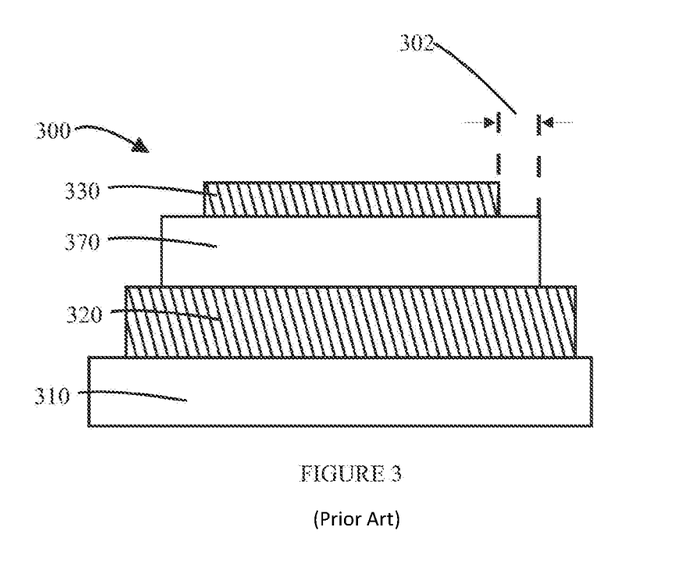
FIG. 3 is cross sectional view of a vertical channel source-drain structure, produced by a typical printing method.
Figure 4:
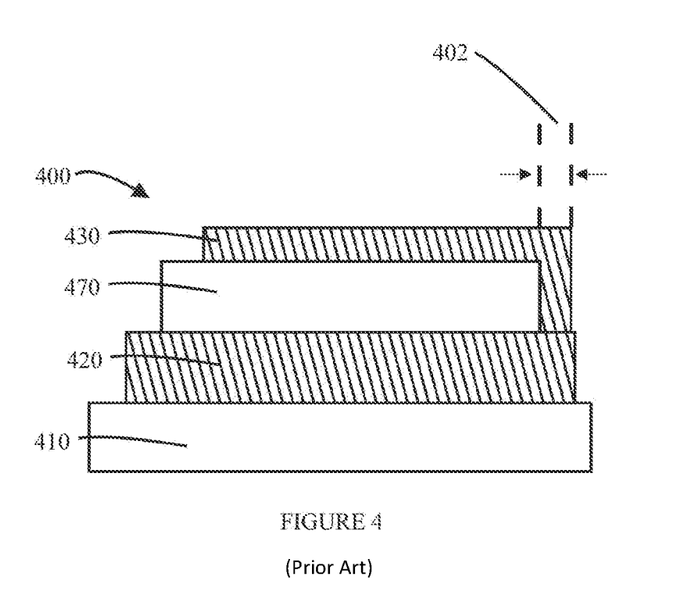
FIG. 4 is cross sectional view of a vertical channel source-drain structure, produced by a typical printing method.

It is a common knowledge that conventional printing methods cannot print high resolution images in horizontal direction but the conventional printing methods can print very thin layers (even in nanometer range) in the vertical direction. Therefore, production of the vertical channel FETs by a conventional printing method, with the channel length in nanometer range, should be possible. The manufacture of the vertical channel, i.e. vertical source-drain structure by a conventional printing method, has another problem. This problem is explained in FIG. 3 and FIG. 4. In FIG. 3 (and FIG. 4) a first conducting layer 320 (420) is printed on a substrate 310 (410). On top of the first conducting layer 320 (420) is printed an insulating layer 370 (470). On top of the insulating layer 370 (470) is printed a second conducting layer 330 (430). As conventional printing methods are not good enough to print precisely in micrometer range, it is likely that the perimeter of the insulating layer 370 (470) and the perimeter of the second conducting layer 330 (430) will not overlap precisely. One possible outcome is that the edge of the insulating layer 370 and the edge of the second conducting layer 320 are separated by a gap of 302, which has a size in the order of several tens of micrometers (>20 micrometer), as shown in FIG. 3. Another possible outcome is that a portion 402 of the second conducting layer 430 can be printed over the first conducting layer 410 and will create a short circuit to the first conducting layer 420 bypassing the insulating layer 470, as shown on the right hand side in FIG. 4. Therefore, printing source-drain layers one over another, separated by an insulating layer, is not an option at all.

Therefore, there is a need to develop a vertical channel FET structure along with a method of its production, by using conventional printing methods. The vertical channel FET disclosed here comprises of a vertical channel source-drain structure that is produced by transferring one conducting layer over another conducting layer, by using an insulating adhesive layer. Transfer printing of a metallic layer to a non-conducting material (paper or plastic) is known in the printing industry and is called 'hot foil transfer printing' and 'cold foil transfer printing'. Hot foil and cold foil transfer printings are used mostly for aesthetic purpose in packages, book, cards etc.

SUMMARY OF THE INVENTION

The present invention relates to a vertical channel field-effect transistor. The vertical channel field-effect transistor comprises a primary substrate and a secondary substrate. A bottom conducting layer is provided on the primary substrate. In one aspect, the bottom conducting layer is provided by using a printing method and by using at least one first conducting ink. A transferrable conducting layer is provided on the secondary substrate. In an aspect, the transferable conducting layer is provided by using a printing method and by using at least one second conducting ink. An insulating adhesive layer is printed on a desired portion of either the bottom conducting layer or the transferable conducting layer. A top conducting layer is created by transferring a portion of the transferable conducting layer from the secondary substrate to the primary substrate, by using the insulating adhesive layer in such a way that a portion of the top conducting layer overlaps with the bottom conducting layer. The portion of the perimeter of the top conducting layer that is over the bottom conducting layer defines the channel width of the vertical channel field-effect transistor. At least one semiconducting layer is provided on and around a perimeter of at least a portion of the channel width. At least one insulating layer is provided on at least a portion of the at least one semiconducting layer. At least one gate conducting layer provided on at least a portion of the at least one insulating layer.

BRIEF DESCRIPTION OF THE DRAWINGS

For a more complete understanding of the present invention and the advantages thereof, reference is now made to the following description and the accompanying drawings, in which.

DETAILED DESCRIPTION OF THE PREFERRED EMBODIMENTS

The invention will now be described in detail. Drawings and examples are provided for better illustration of the invention. It will be understood that the embodiments and aspects of the invention described herein are only examples and do not limit the protector's scope of the claims in any way. The invention is defined by the claims and their equivalents. It will be understood that features of one aspect or embodiment of the invention can be combined with the feature of a different aspect or aspects and/or embodiments of the invention.

The terms "print," "printability," "printing," "printable" and "printed", as used in this disclosure, refer to production methods using functional inks. More specifically, these production methods include, but are not limited to, screen-printing, stenciling, flexography, gravure, off-set, thermal transfer and ink-jet printing. These printing methods can be roll-to-roll or sheet-fed or manual. The term "ink" as used in this disclosure refers to a material that is in liquid or semi-solid or, paste form. It will be understood that, after printing of an ink on a surface, a drying or curing process may be required to convert the ink into a solid or a gel form. Typically, heat and/or radiation are used for the drying or curing processes. The drying or curing processes can also be self-activated. The term "functional group" as used in this disclosure refers to a specific group of atoms or bonds within a molecule or a polymer that are responsible for a specific chemical reaction. For example, in a conjugated polymer double bonds between carbon atoms are called functional groups, which may participate in a radical reaction.

The present invention relates to a vertical channel field-effect transistor (FET). Most of the layers of the vertical channel FET are deposited by conventional printing methods, by using functional inks. In one aspect of the disclosure, the printed vertical channel FET comprises a vertical channel that is produced by transferring one conducting layer over another, by using printed adhesive layer.

Figure 5A:
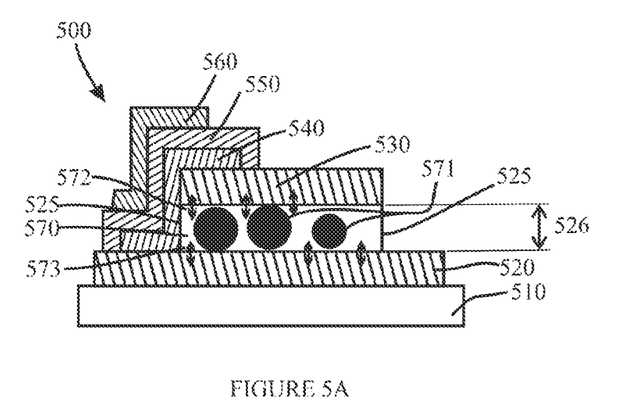
FIG. 5A is cross sectional view of a vertical channel Field-effect transistor, in accordance with an aspect of the present invention.

FIG. 5A illustrates a cross-sectional view of a vertical channel FET 500. The vertical channel FET 500 includes a primary substrate 510. The primary substrate 510 can be made of, but not limited to, plastic, paper, textile, glass or a laminate of different materials etc. The primary substrate 510 can be mechanically flexible or mechanically rigid. The primary substrate 510 can be transparent or opaque to electromagnetic radiation. A pattern of a bottom conducting layer 520 is provided on top of the primary substrate 510. The pattern can be in the shape of a square, rectangle, circle or any other shape needed. In one non-limiting example, the bottom conducting layer 520 can be produced by a printing method, by using at least one first conducting ink.

In one aspect of the innovation, the first conducting ink is based on conducting conjugated polymers e.g. PEDOT:PSS, PANI (polyaniline) etc. It is known that PEDOT:PSS and PANI are partly transparent to visible light. In one aspect of the innovation, the at least one first conducting ink is based on metal particles e.g. silver, copper etc. In one aspect of the innovation, the at least one first conducting ink is based on carbon particles e.g. graphite, carbon black, carbon nanotube, graphene etc. The at least one first conducting ink comprises at least one first functional group such that at least some of the at least one first functional group are present on the top surface of the bottom conducting layer 520.

In one non-limiting aspect, the at least one first functional group can be selected from alkynyl, hydroxyl, cyanate, isocyanate, nitrile, isonitrile, pyridyl, thiol, thocyanate, isothiocyanate, amine, acrylate, methacrylate, vinyl, allyl, thiophene, pyrrole, epoxy or a combination thereof. In one non-limiting aspect, the at least one first functional group is an alkene. An alkene is a carbon double bond present in a molecule or a polymer. The at least one first functional group can be a part of a molecule or a polymer. These molecules or polymers can be added into the first conducting ink. For example, polyethylene glycol diacrylate is added into a PEDOT:PSS based ink or Bisphenol A epoxy is added in a silver particles based ink. In one non-limiting aspect the carbon double bonds present is PEDOT:PSS polymer chain can also work as the first functional group.

In another non-limiting example, the first conducting layer 520 can also be produced by depositing a metallic layer, by a vacuum technology e.g. chemical vapor deposition, physical vapor deposition and atomic layer deposition or by electrochemical deposition.

In another non-limiting example, the first conducting layer 520 can be produced by etching a metalized substrate.

In one-non-limiting example, the first conducting layer 510 can be transparent or semi-transparent to UV, visible or Infrared.

The bottom conducting layer 520 works as a source (or as a drain) of the vertical channel FET 500. The drain (or the source) of the vertical channel FET 500 is provided on top of the bottom conducting layer 520 by a transfer method. A portion of a transferrable conducting layer is transferred from a secondary substrate to the primary substrate 510 by using an adhesive layer 570. The transferred conducting layer is called here as the top conducting layer 530 and it works as a drain (or as a source) of the vertical channel FET 500. In one non-limiting example, the adhesive layer 570 is electrically insulating. The adhesive layer 570 keeps the top conducting layer 530 and the bottom conducting layer 520 from touching each other and hence preventing electrical shorts. The horizontal dimension of the top conducting layer 530 is substantially same as the horizontal dimension of the adhesive layer 570. The plane of the primary substrate 510 is defined here as the horizontal plane. In a non-limiting example, a surface of a glass bottle, working as a primary substrate, has a curved surface hence the horizontal plane is in this non-limiting example of a glass bottle, curved. In a further non-limiting example, a surface of a flat glass piece, working as a primary substrate, has a flat surface hence the horizontal plane is in this non-limiting example of the glass piece flat. The plane of the primary substrate 510 can be flat or non-flat or curved. The horizontal dimension of the top conducting layer 530 is the shape of the top conducting layer 530 in the horizontal plane. The horizontal dimension of the adhesive layer 570 is the shape of the adhesive layer 570 in the horizontal plane. That means the shape of top conducting layer 530 is matching with the shape of the adhesive layer 570 and the shape of the top conducting layer 530 is substantially overlapping with the shape of the adhesive layer 570.

The top conducting layer 530 comprises at least one second functional group. In one non-limiting aspect, the at least second functional group can be selected from alkynyl, hydroxyl, cyanate, isocyanate, nitrile, isonitrile, pyridyl, thiol, thocyanate, isothiocyanate, amine, acrylate, methacrylate, vinyl, allyl, thiophene, pyrrole, epoxy or, a combination thereof. In one non-limiting aspect, the at least one second functional group is an alkene. The at least one second functional group can be a part of a molecule or a polymer. These molecules or polymers can be a part of the top conducting layer 530. For example, polyethylene glycol diacrylate in a PEDOT:PSS conducting layer or, Bisphenol A epoxy in a silver particles based conducting layer. In one non-limiting aspect the carbon double bonds present are a PEDOT:PSS polymer chain and can also work as the second functional group.

In one non-limiting aspect, the adhesive layer 570 can be a UV curable adhesive. In another non-limiting aspect, the adhesive layer 570 can be a visible light curable adhesive. In one non-limiting aspect, the adhesive layer 570 can be an infrared curable adhesive. In one non-limiting aspect, the adhesive layer 570 can be a pressure sensitive adhesive. In one non-limiting aspect, the adhesive layer 570 can be a heat sensitive adhesive. In one non-limiting aspect, the adhesive layer 570 can be an epoxy adhesive. The adhesive layer 570 can comprise at least one type of insulating particles 571. In one non-limiting aspect, the at least one insulating particle 571 can be substantially spherical. In one-non-limiting aspect, the at least one insulating particles 571 can be silica gel. In one non-limiting aspect, the diameter of at least one insulating particles is less than 25 micrometers.

The adhesive layer 570 further comprises at least one third functional group. In one non-limiting aspect, the at least one third functional group can be selected from acrylate, methacrylate, vinyl, allyl or, a combination thereof. In one non-limiting aspect, the at least one third functional group can be epoxy. Upon activation, the at least one third functional group of the adhesive layer 570 reacts with the at least one first functional group of the bottom conducting layer 520 and creates chemical bonds 573. Upon activation, the at least one third functional group of the adhesive layer 570 can also react with the at least one second functional group of the top conducting layer 530 and create chemical bonds 572.

Figure 5B:
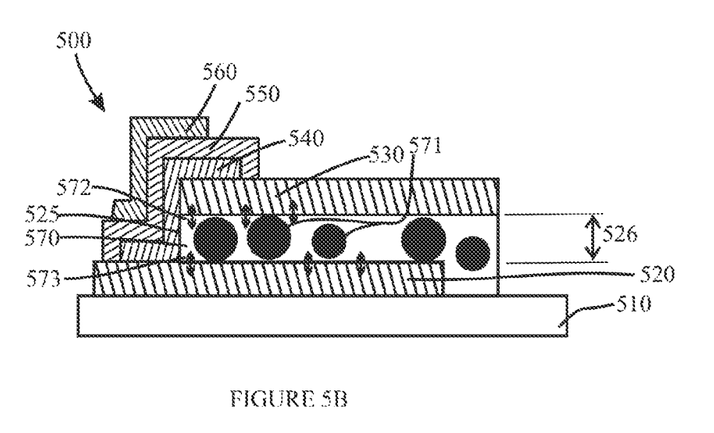
FIG. 5B is cross sectional view of a vertical channel Field-effect transistor, in accordance with another aspect of the present invention.
Figure 5C:
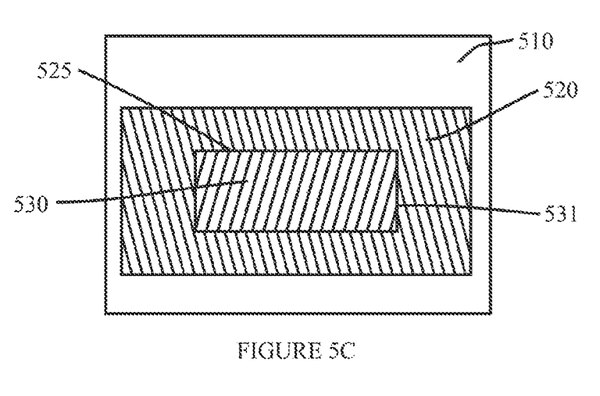
FIG. 5C is a top view of the source-drain of the vertical channel Field-effect transistor, in accordance with an aspect of the present invention.
Figure 5D:
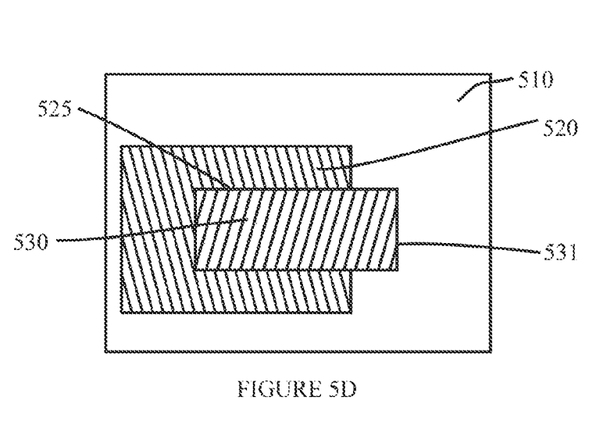
FIG. 5D is a top view of the source-drain of the vertical channel Field-effect transistor, in accordance with another aspect of the present invention.

The thickness of the adhesive layer 570 defines the channel length 526 of the vertical channel FET 500. The portion of the perimeter 531 of the top conducting layer 530 that is overlapping the bottom conducting layer 510, defines the maximum channel width 525. In FIG. 5A the complete adhesive layer 570 lies on a top surface of the bottom conducting layer 520 that means the complete top conducting layer 530 is over the bottom conducting layer 520. FIG. 5C shows the top view of the FIG. 5A but without the semiconducting layer 540, the insulating layer 550 and the gate conducting layer 560. In this case, the total perimeter 531 of the top conducting layer 530 is the maximum channel width 525. In FIG. 5B a portion of the adhesive layer 570 lies on the bottom conducting layer 520 and another portion of the adhesive layer 570 lies on the primary substrate 510. In this case, only a portion of the top conducting layer 530 is over the bottom conducting layer 510. FIG. 5D shows the top view of the FIG. 5B but without the semiconducting layer 540, the insulating layer 550 and the gate conducting layer 560. In this case, the maximum channel width 525 is equal to the part of the perimeter 531 of the top conducting layer 530 that overlaps the bottom conducting layer 510. That means in this case the channel width 525 is smaller than the perimeter 531. At least one semiconducting layer 540 is provided on at least a portion of the channel width 525 and around a perimeter of the channel width 525. The semiconducting layer 540 must connect the bottom conducting layer 520 and the top conducting layer 530. In one non-limiting aspect, the semiconducting layer 540 is provided only on a part of the maximum channel width 525. Some part of the semiconducting layer 540 may lie on top of the top conducting layer 530. Some part of the semiconducting layer 540 may lie on top of the bottom conducting layer 520.

The semiconducting layer 540 may incorporate any of the organic or inorganic semiconductors. The organic semiconductors are solution processable while being conducive towards deposition through cost effective layer formation technologies like printing and spin coating. Exemplary materials include, but are not limited to, polythiophene or derivative thereof; polyaniline or derivative thereof; pentacene, fullerene and derivatives thereof, thiophene oligomers, polyfluorene derivates, metal phthalocyanine (PC) complexes. Additionally, the organic semiconductor materials may be partially or wholly replaced with inorganic semiconductor materials, traditionally used as the semiconducting layers in inorganic electronic devices like, silicon, gallium arsenide, gallium nitride, zinc oxide, tin oxide and gallium phosphide.

In one non-limiting aspect, the semiconducting layer 540 is based on carbon nanotube or graphene. The semiconducting layer 540 can be provided by a single printing process or by a multiple printing processes of different or same semiconducting materials.

On top of the semiconducting layer 540, is provided at least one insulating layer 550. The insulating layer 550 may incorporate organic, inorganic, hybrid dielectric or electrolytic materials which may include, but are not limited to, high-K dielectrics such as: barium titanate ($BaTiO_3$) or perovskites or, non-aqueous solid electrolytic polymer composites. The material of the insulating layer 550 can be electrically insulating. In one non-limiting aspect, the insulating layer 550 is an ionic conducting material. The insulating layer 550 can be provided by a single printing step or by multiple printing steps of same or different dielectric materials.

A gate conducting layer 560 is provided on top of the insulating layer 550. The gate conducting layer 560 can be provided by using a printing method and, by using a conducting ink e.g. PEDOT:PSS, silver, carbon etc.

FIG. 6 shows in detail how the different layers of the vertical channel FET 500 are produced. A bottom conducting layer 620 is provided on a primary substrate 610, as shown in FIG. 6A. In a non-limiting aspect, the bottom conducting layer 620 can be provided by a printing method by using a first conducting ink. In another non-limiting aspect, the bottom conducting layer 620 can be provided by using vacuum deposition techniques e.g. chemical vapor deposition, physical vapor deposition, atomic layer deposition. In another non-limiting aspect, the bottom conducting layer 620 can be provided by electrochemical deposition of metal on the primary substrate 610. The adhesion of the bottom conducting layer 620 to the primary substrate 610, should be substantially strong. In order to increase the adhesion, further treatment—plasma treatment, coating etc.—of the primary substrate 610 can also be done. In a non-limiting example, the bottom conducting layer 610 may comprise at least one first functional group. The details about the at least one first functional group are discussed above.

Figure 6A:
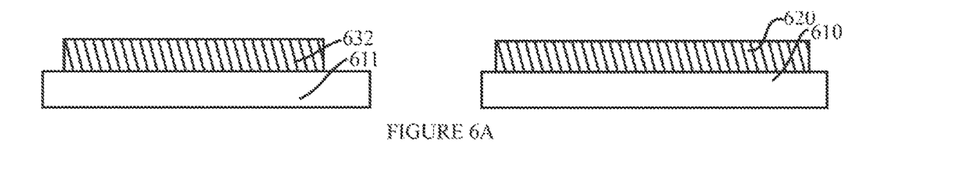
FIG. 6A is a cross sectional view of the bottom conducting layer on the primary substrate and the transferrable conducting layer on the secondary substrate.

A transferrable conducting layer 632 is provided on a secondary substrate 611, as shown in FIG. 6A. In one non-limiting example, the transferrable conducting layer 632 can be produced by a printing method, by using at least one second conducting ink. In one aspect of the innovation, the second conducting ink is based on conducting conjugated polymers e.g. PEDOT:PSS, PANI etc. In one aspect of the innovation, the at least one second conducting ink is based on metal particles e.g. silver, copper etc. In one aspect of the innovation, the at least one second conducting ink is based on carbon particles e.g. graphite, carbon black, carbon nanotube, graphene etc. The at least one second conducting ink comprises at least one second functional group such that at least some of the at least one second functional group are present on the top surface of transferrable conducting layer 632. In one non-limiting aspect, the at least one second functional group can be selected from alkynyl, hydroxyl, cyanate, isocyanate, nitrile, isonitrile, pyridyl, thiol, thocyanate, isothiocyanate, amine, acrylate, methacrylate, vinyl, allyl, thiophene, pyrrole, epoxy or a combination thereof. In one non-limiting aspect, the at least one second functional group is an alkene. The at least one second functional group can be a part of a molecule or a polymer. These molecules or polymers can be added into the second conducting ink. For example, polyethylene glycol diacrylate is added into a PEDOT:PSS based ink or Bisphenol A epoxy is added in a silver particles based ink. In one non-limiting aspect the carbon double bonds present is PEDOT:PSS can also work as the second functional group.

In another non-limiting example, the transferrable conducting layer 632 can also be produced by depositing a metallic layer, by a vacuum technology e.g. chemical vapor deposition, physical vapor deposition and atomic layer deposition. In another non-limiting example, the transferrable conducting layer 632 can be produced by etching a metalized substrate. In one-non-limiting example, the transferrable conducting layer 632 can be transparent or semi-transparent to UV, visible or Infrared. The adhesion of the transferrable conducting layer 632 to the secondary substrate 611 should be substantially weak.

Figure 6B:
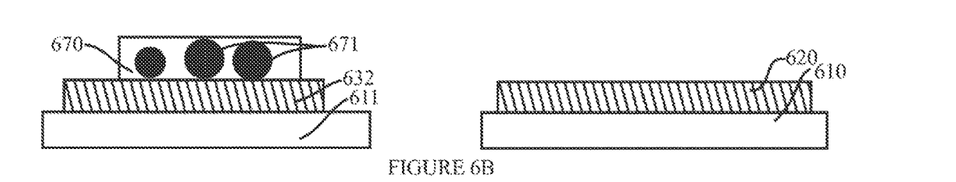
FIG. 6B is a cross sectional view of the bottom conducting layer on the primary substrate and the insulating adhesive layer on the transferrable conducting layer.
Figure 6C:
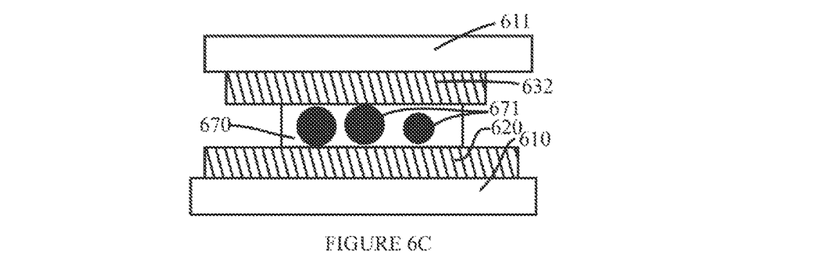
FIG. 6C is a cross sectional view of the primary substrate and the secondary substrate after lamination.

An insulating adhesive layer 670 is provided on top of the transferrable conducting layer 632, as shown in FIG. 6B. In a non-limiting aspect, only a portion of the insulating adhesive layer 670 is provided on top of the transferrable conducting layer 632 and rest of the insulating layer 670 lies on top of the secondary substrate 611, which is not shown in figures. The insulating adhesive layer 670 can be provided by a printing method by using an adhesive ink, in a desired pattern. The insulating adhesive layer 670 can be provided on the bottom conducting layer 610, instead of the transferrable conducting layer 632, depending on the production process requirements. In a non-limiting example, the insulating adhesive layer 670 may comprise substantially spherical insulating particles 671. In a non-limiting example, the insulating adhesive layer 670 may comprise at least one third functional group. The details about at least the one third functional group are discussed above. In the next step, as shown in FIG. 6C, the primary substrate 610 and the secondary substrate 611 are laminated in such a way that the insulating adhesive layer 670 is sandwiched between the bottom conducting layer 610 and the transferrable conducting layer 632. In a non-limiting example, the insulating adhesive layer 670 is sandwiched between a portion of the bottom conducting layer 610 and a portion of the transferrable conducting layer 632, which is not shown in FIGURES.

Figure 6D:
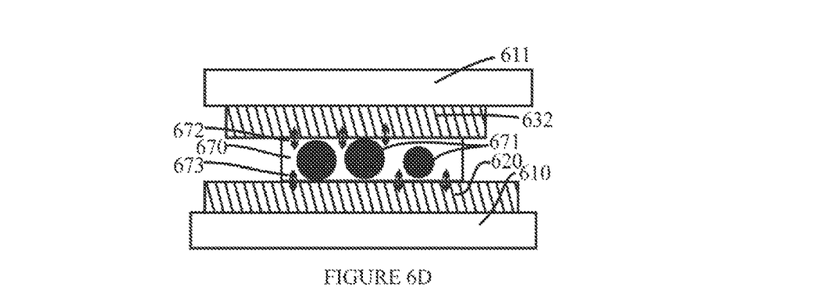
FIG. 6D is a cross sectional view of the primary substrate and the secondary substrate after activation of the insulating adhesive layer.

After that, the insulating adhesive layer 670 is activated, as shown in FIG. 6D. In a non-limiting example, the activation of the insulating adhesive layer 670 is done by heat. In a non-limiting example, the activation of the insulating adhesive layer 670 is done by UV curing. In a non-limiting example, the activation of the insulating adhesive layer 670 is done by infrared curing. In a non-limiting example, the activation of the insulating adhesive layer 670 is done by pressure. In a non-limiting example, the activation of the insulating adhesive layer 670 is done by visible light. The activation of the insulating adhesive layer creates chemical bonds 673 between some of the at least one first functional groups and some of the at least one third functional group. The activation of the insulating adhesive layer creates chemical bonds 672 between some of the at least one second functional groups and some of the at least one third functional group.

Figure 6E:
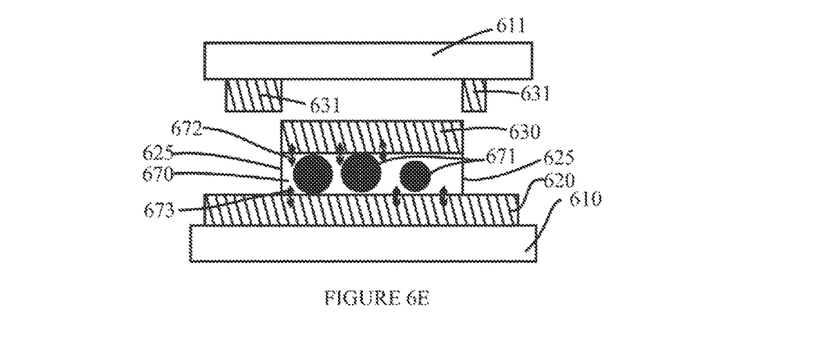
FIG. 6E is a cross sectional view of the primary substrate and the secondary substrate after delimitation.
Figure 6F:
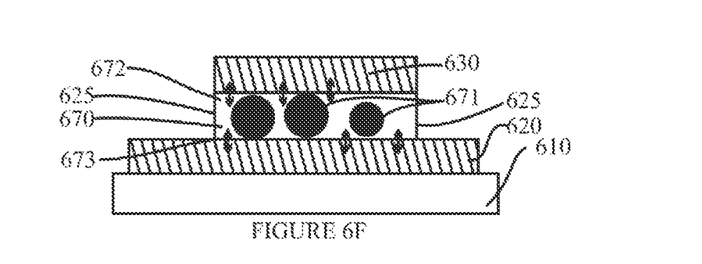
FIG. 6F is a cross sectional view of the vertical channel source-drain structure, in accordance with an aspect of the present invention.
Figure 6G:
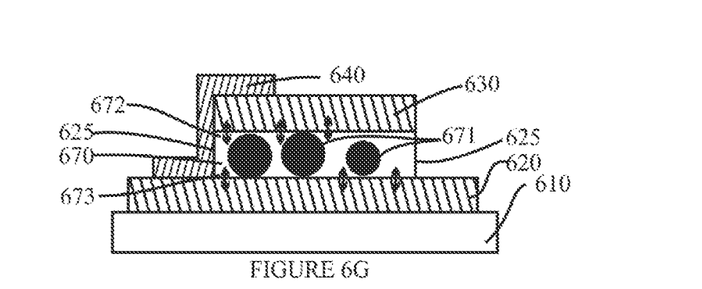
FIG. 6G is a cross sectional view of the vertical channel source-drain structure with the semiconducting layer.

In the next step, the primary substrate 610 is mechanically delaminated from the secondary substrate 611, as shown in FIG. 6E. In a non-limiting example, the mechanical delamination can be carried out manually. In a non-limiting example, the mechanical delamination can be carried out by a cold-foil transfer machine or by a hot-foil transfer machine. This causes transfer of a portion of the transferrable conducting layer 632 from the secondary substrate 611 to the primary substrate 610. The secondary substrate 611 is left with the rest of the transferrable conducting layer 631. FIG. 6F shows the source-drain structure produced by the combination of the bottom conducting layer 620 and the portion of the top conducting layer 630. The thickness of the insulating adhesive layer 670 defines the channel length of the vertical channel FET. The portion of the perimeter of the top conducting layer 630 that is over the bottom conducting layer 610, defines the maximum channel width 625. After that, at least one semiconducting layer 640 is provided on a portion of the channel width 625 and around a perimeter of the channel width 625, as shown in FIG. 6G.

Figure 6H:
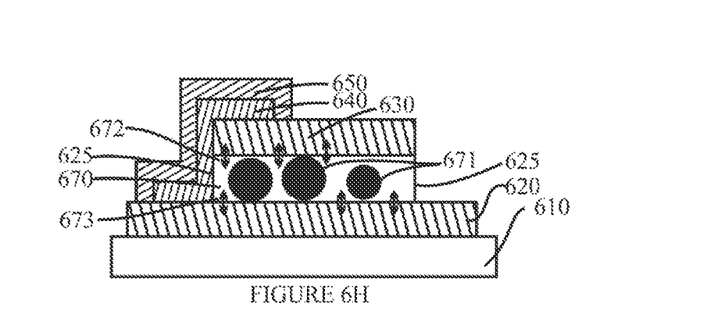
FIG. 6H is a cross sectional view of the vertical channel source-drain structure with the semiconducting layer and the insulating layer.
Figure 6I:
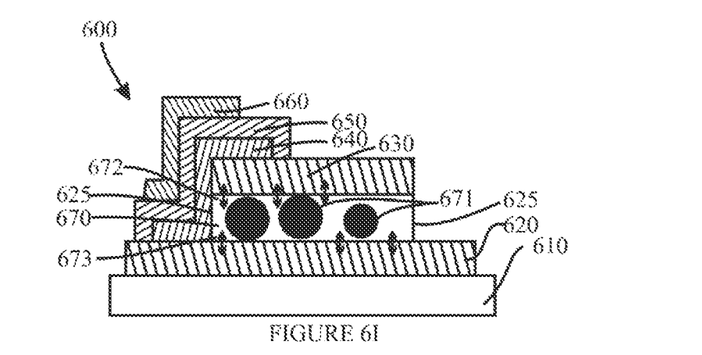
FIG. 6I is a cross sectional view of the vertical channel source-drain structure with the semiconducting layer, the insulating layer and the gate conducting layer.

In one non-limiting example the at least one semiconducting layer 640 can be provided by a printing method by using inks. On top of the at least one semiconducting layer 640 is provided at least one insulating layer 650, as shown in FIG. 6H. The insulating layer 650 can be provided by a single printing step or by multiple printing steps of same or different dielectric materials. A gate conducting layer 660 is provided on top of the insulating layer 650 to complete the vertical channel FET 600. The gate conducting layer 660 can be provided by using a printing method and by using a conducting ink as shown in FIG. 6I. It is understood that after printing an ink in any of the steps mentioned in FIG. 6A-6H, a curing or drying step may be needed, depending on the ink used.

Figure 7:
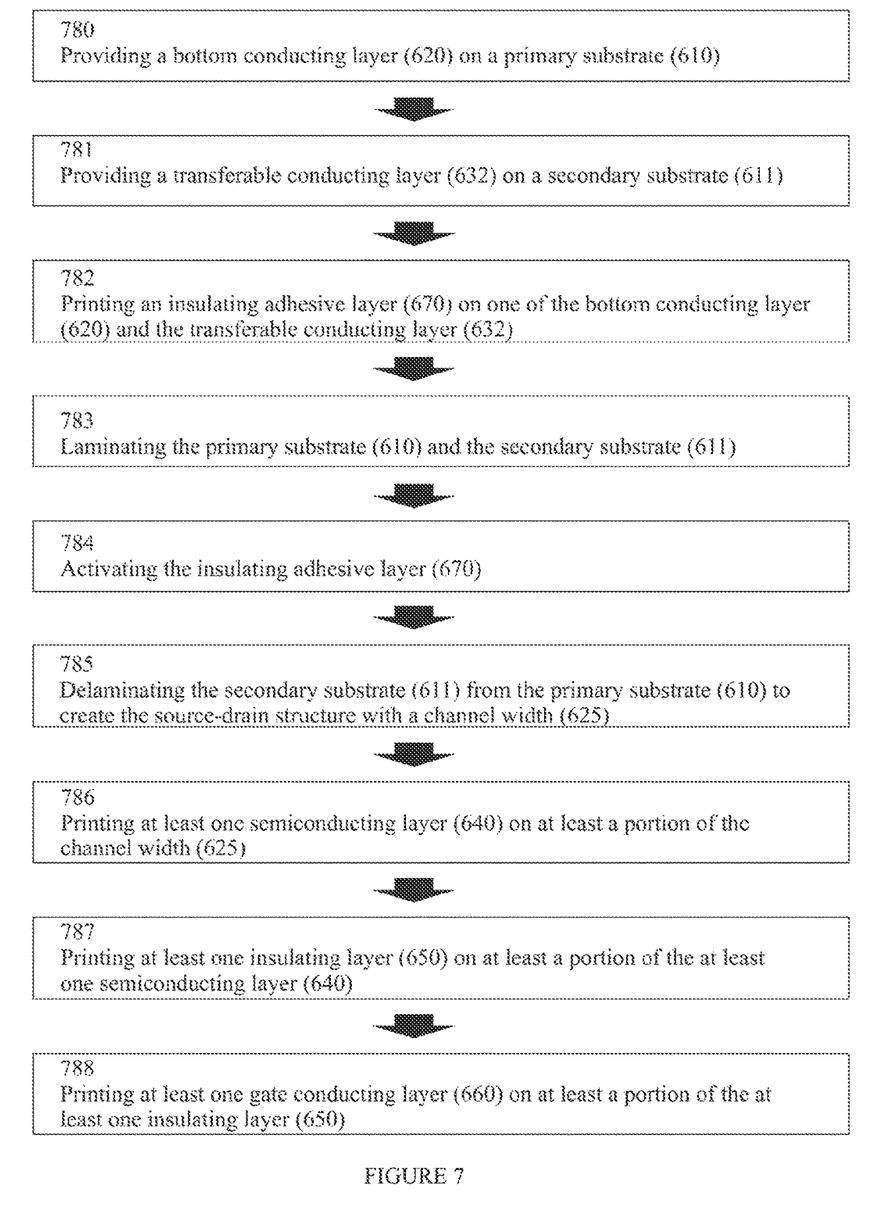
FIG. 7 is a flow chart showing a manufacturing process to produce the vertical channel Field-effect transistor according to one exemplary embodiment of the present disclosure.

The vertical channel Field effect transistor 600 can be produced according to the following exemplary process, as illustrated in FIG. 7:

In the step 780, a bottom conducting layer 620 is provided on a primary substrate 610.

In the step 781, a transferrable conducting layer 632 is provided on a secondary substrate 611.

In the step 782, an insulating adhesive layer 670 is provided either on top of the transferrable conducting layer 632 or on top of the bottom conducting layer 620.

In the step 783, the primary substrate 610 and the secondary substrate 611 are laminated in such a way that at least a portion of the insulating adhesive layer 670 is sandwiched between the bottom conducting layer 610 and the transferrable conducting layer 632.

In the step 784, the insulating adhesive layer 670 is activated.

In the step 785, the primary substrate 610 is mechanically delaminated from the secondary substrate 611.

In the step 786, at least one semiconducting layer 640 is provided on a portion of the channel width 625 and around a perimeter of the channel width 625.

In the step 787, on top of the at least one semiconducting layer 640 is provided at least one insulating layer 650.

In the step 788, a gate conducting layer 660 is provided on top of the insulating layer 650 to complete the vertical channel Field effect transistor 600.

The advantages afforded by a vertical channel field-effect transistor, fabricated by the process outlined herein, include, while not being limited to, their low working voltages (around 1 Volt) as compared to horizontal channel organic field effect transistors and many vertical channel field effect transistors wherein the 'on' voltages can exceed tens of volts, compared to less than 5 volts achieved with this invention. The number of process steps required for the fabrication of such a device is also low in the present invention compared to the industrial norm for vertical channel organic field effect transistors which incorporate, patterning processes for multiple layers along with relatively complex layer deposition techniques, sometimes requiring multiple machines and constantly maintained vacuum environments during manufacturing. An additional advantage of the present design and architecture is the ready capability of the final device to supply high current outputs in the order of milliamperes at voltages below 5 volts D.C. at the gate and drain terminals. An additional advantage gained from the architecture presented herein, is the possibility to mass-produce both, n-channel and p-channel field effect transistors, without any change in the manufacturing process. Additionally, ambipolar channel field effect transistor can also be fabricated through this method. This, when coupled with the possibility of incorporating conventional printing for the fabrication of the entire device, allows for a significant and immediate application in the field of cheap printed/flexible logic circuits. Semiconductor devices fabricated with the present device architecture allow for, but are not limited to, a number of wide ranging applications such as: control circuitry, CMOS chips, computer circuitry and mobile phone hardware, display technologies and wireless communication/power transfer.

Although, some preferred embodiments of the architecture described herein have been described with regards to a single vertical channel field effect transistor, those skilled in the art will understand that the architecture described herein may also be employed to fabricate other types of electronic devices, including other adaptations, alternatives and modifications within the scope of the present invention. Those skilled in the art may also recognize that in the device reported herein, the source and drain electrodes may be exchanged so that the first conducting layer 510 may be, for example, the source rather than the drain electrode. Additionally, the present invention is not limited by the preferred embodiments, but, is only limited by the included claims.

The printed transistor was fabricated without incorporating any expensive or complex process/production steps such as patterning, chemical/atomic vapor deposition, laser ablation etc. In this example a conducting polymer making up the bottom conducting layer, measuring 3 cm×2 cm, was printed over a 100 micrometers thick polyethylene terephthalate (PET) film that acts as the primary substrate. The conducting polymer used in this example was PEDOT.PSS. Another layer of PEDOT.PSS (an area of 3 cm×2 cm) making up the transferable conducting layer was printed onto another 100 micrometers thick layer of PET film referred to as the secondary substrate.

A layer of adhesive material measuring 2 cm×1 cm was then printed on top of the transferable conducting layer such that the adhesive material layer lies within the boundary of the transferable conducting layer. The adhesive material is selected from a group of adhesive materials such as, but not limited to, acrylate, methacrylate, allyl, vinyl and combinations thereof. A sandwich structure of the bottom conducting layer, the adhesive layer and the transferrable conducting layer was then created by laminating the primary substrate and the secondary substrate. The adhesive layer was cured using electromagnetic radiation.

The adhesive layer can also be cured using myriad curing processes which include but are not limited to temperature, pressure, chemical reaction etc. The electromagnetic radiation used herein lay between the frequency band assigned for ultraviolet frequencies.

The two PET substrates were then separated physically in such a way that a part of the transferable conducting layer is transferred on to the bottom conducting layer. The transferred PEDOT:PSS conducting layer is called here the top conducting layer which has the shape of adhesive layer i.e. 2 cm×1 cm.

The resulting architecture creates a vertically oriented sandwich of two PEDOT:PSS conducting layers that are separated by an insulating adhesive layer of a distance of 8 micrometers or less. The overlapping sandwich structure measures an area of 2 cm×1 cm. A suitable semiconducting layer is then printed over this sandwich structure with regards to the functionality required from the final transistor device. In this example a p-type semiconductor polymer layer (e.g. thiophene based polymer) measuring 4 cm×0.5 cm was printed over the interface/edge of the sandwich structure such that the p-type semiconductor was in contact with the bottom conducting PEDOT:PSS layer and the top conducting PEDOT:PSS layer.

A suitable dielectric was printed onto the previously mentioned semiconductor layer. The dielectric used is not limited to organic materials and can also be an inorganic material or a combination of organic and inorganic dielectric materials.

A subsequent highly conducting layer (water based silver particle ink) measuring 5 cm×0.2 cm was printed over the aforementioned dielectric layer such that the highly conducting layer would act as the gate conducting layer of the final fabricated device and would also lie on the interface of the top and bottom conducting layers. The gate conducting layer can be a metallic conductor but is not limited to metals and can be a conducting organic or inorganic polymer.

The resulting device was tested in ambient conditions and was seen to function well as a p-type field effect transistor with a threshold voltage of 1 volt with a respective source-drain gating current of more than 0.4 milli-ampere. Similar results have been obtained with regards to n-type (ZnO nanomaterials) field effect transistors fabricated using the present approach demonstrating the feasibility of this approach for practical thin flexible electronic applications.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method of producing a vertical channel field-effect transistor, comprising the steps of:
   providing a bottom conducting layer on a primary substrate, the bottom conducting layer comprising at least one first functional group;
   providing a transferable conducting layer on a secondary substrate, the transferable conducting layer comprising at least one second functional group;
   printing an insulating adhesive layer on at least one of the bottom conducting layer and the transferable conducting layer, the insulating layer comprising at least one third functional group;
   laminating the primary substrate and the secondary substrate, wherein at least a portion of the insulating adhesive layer is sandwiched between the bottom conducting layer and the transferrable conducting layer;
   activating the insulating adhesive layer, thereby causing some of the at least one third functional group to make chemical bonds with some of the at least one first functional group and with some of the at least one second functional group;
   delaminating the secondary substrate from the primary substrate, wherein a top conducting layer is created from the transferrable conducting layer, the horizontal dimension of the top conducting layer is same as the horizontal dimension of the insulating adhesive layer such that a portion of a perimeter of the top conducting layer over the bottom conducting layer defines a channel width of the vertical channel field-effect transistor;
   printing at least one semiconducting layer on at least a portion of the channel width;
   printing at least one insulating layer on at least a portion of the at least one semiconducting layer; and
   printing at least one gate conducting layer on at least a portion of the at least one insulating layer.

2. The method of claim 1, wherein the activation of the insulating adhesive layer is done by at least one of UV radiation, infrared radiation, heat, electron beam or pressure.

3. The method of claim 1, wherein the bottom conducting layer comprises at least one conjugated polymer and the at least one conjugated polymer is provided on the primary substrate by a printing method.

4. The method of claim 1, wherein the transferable conducting layer comprises at least one conjugated polymer and the at least one conjugated polymer is provided on the secondary substrate by a printing method.

5. The method of claim 1, wherein at least one of the bottom conducting layer (620) and the transferable conducting layer is produced by using particles based ink.

6. The method of claim 1, further comprising the steps of drying and curing at least one of the bottom conducting layer, the transferrable conducting layer, the at least one semiconducting layer, the at least one insulating layer and the at least one gate conducting layer.

* * * * *